US008568530B2

(12) United States Patent
Heys et al.

(10) Patent No.: US 8,568,530 B2
(45) Date of Patent: Oct. 29, 2013

(54) USE OF CYCLOPENTADIENYL TYPE HAFNIUM AND ZIRCONIUM PRECURSORS IN ATOMIC LAYER DEPOSITION

(75) Inventors: Peter Nicholas Heys, Crewe (GB); Paul Williams, Wirral (GB); Fuquan Song, Eastham (GB)

(73) Assignee: Sigma-Aldrich Co. LLC, St. Louis, MO (US)

( * ) Notice: Subject to any disclaimer, the term of this patent is extended or adjusted under 35 U.S.C. 154(b) by 1468 days.

(21) Appl. No.: 12/093,846

(22) PCT Filed: Jun. 8, 2006

(86) PCT No.: PCT/GB2006/002119
§ 371 (c)(1),
(2), (4) Date: May 15, 2008

(87) PCT Pub. No.: WO2006/131751
PCT Pub. Date: Dec. 14, 2006

(65) Prior Publication Data
US 2008/0282970 A1 Nov. 20, 2008

(30) Foreign Application Priority Data

Nov. 16, 2005 (GB) .................................. 0523339.0

(51) Int. Cl.
*C30B 25/00* (2006.01)
(52) U.S. Cl.
USPC .................. 117/89; 117/84; 117/88; 117/93; 117/102; 117/105; 420/422; 556/51
(58) Field of Classification Search
USPC .......... 117/84, 88, 89, 93, 102, 105; 420/422; 556/51
See application file for complete search history.

(56) References Cited

U.S. PATENT DOCUMENTS

| | | | |
|---|---|---|---|
| 4,581,249 A | 4/1986 | Kamiya | 427/53.1 |
| 5,393,564 A | 2/1995 | Westmoreland et al. | 427/248.1 |
| 5,395,954 A | 3/1995 | Soria | 556/10 |
| 5,464,656 A | 11/1995 | Verkade | 427/248.1 |
| 5,508,458 A | 4/1996 | Zhao | 556/45 |
| 5,527,752 A | 6/1996 | Reichle | 502/117 |
| 5,556,821 A * | 9/1996 | Aida et al. | 502/113 |
| 5,625,086 A | 4/1997 | Lisowsky | 556/54 |

(Continued)

FOREIGN PATENT DOCUMENTS

| EP | 0460254 | 12/1991 |
|---|---|---|
| JP | 2001-247587 | 9/2001 |

(Continued)

OTHER PUBLICATIONS

Alt HG and Denner CE, *Zirconocene Ethylene Complexes*, J. Org. Chem. 391:53-60 (1990).

(Continued)

*Primary Examiner* — Matthew Song
(74) *Attorney, Agent, or Firm* — Harness, Dickey & Pierce, P.L.C.

(57) ABSTRACT

Precursors suitable for chemical vapor deposition, especially ALD, of hafnium oxide or zirconium oxide, have the general formula:

$$(R^1Cp)_2MR^2$$

wherein Cp represents a cyclopentadienyl ligand, $R^1$ is H or a substituting alkyl group, alkoxy group or amido group of the Cp ligand, $R^2$ is an alkyl group, an alkoxy group or an amido group and M is hafnium or zirconium.

19 Claims, 7 Drawing Sheets

(56) References Cited

U.S. PATENT DOCUMENTS

| | | | |
|---|---|---|---|
| 5,698,022 A | 12/1997 | Glassman | 16/287.18 |
| 5,814,574 A | 9/1998 | McNally | 502/103 |
| 5,900,498 A | 5/1999 | Winter | 556/51 |
| 5,908,947 A | 6/1999 | Vaarstra | 556/42 |
| 6,159,855 A | 12/2000 | Vaarstra | 438/681 |
| 6,248,928 B1 | 6/2001 | Jones | 568/318 |
| 6,277,436 B1 | 8/2001 | Stauf | 427/126.3 |
| 6,280,518 B1 | 8/2001 | Itsuki | 106/287.19 |
| 6,313,035 B1 | 11/2001 | Sandhu | 438/681 |
| 6,376,691 B1 | 4/2002 | Celinska | 556/1 |
| 6,383,669 B1 | 5/2002 | Leedham | 428/702 |
| 6,485,784 B1 | 11/2002 | Leedham | 427/255.31 |
| 6,552,209 B1 | 4/2003 | Lei | 556/42 |
| 6,623,656 B2 | 9/2003 | Baum | 252/62.9 PZ |
| 6,627,765 B2 | 9/2003 | Giolando | 556/87 |
| 6,689,427 B2 | 2/2004 | Min | 427/587 |
| 6,698,728 B1 | 3/2004 | Ravetz et al. | 261/121.1 |
| 6,787,617 B1 * | 9/2004 | Soga et al. | 526/153 |
| 6,946,395 B2 | 9/2005 | Marsh | 438/686 |
| 7,091,129 B2 | 8/2006 | Chau | 438/707 |
| 7,282,119 B2 | 10/2007 | Odedra et al. | 203/29 |
| 7,419,698 B2 | 9/2008 | Jones | 427/248.1 |
| 8,039,062 B2 | 10/2011 | Heys et al. | 427/585 |
| 2007/0122947 A1 | 5/2007 | Sakurai | 427/255.35 |
| 2007/0190684 A1 | 8/2007 | Jones | 427/255.32 |
| 2008/0213940 A1 | 9/2008 | Lee et al. | 438/104 |
| 2008/0274615 A1 | 11/2008 | Vaartstra | 438/685 |
| 2009/0074983 A1 | 3/2009 | Heys et al. | 427/569 |
| 2009/0081385 A1 | 3/2009 | Heys et al. | 427/585 |
| 2010/0256406 A1 | 10/2010 | Kanjolia et al. | 556/136 |
| 2010/0261350 A1 | 10/2010 | Kanjolia et al. | 438/687 |
| 2011/0021803 A1 | 1/2011 | Jin et al. | 558/150 |
| 2011/0151227 A1 | 6/2011 | Chalker et al. | 428/220 |
| 2011/0165401 A1 | 7/2011 | Chalker et al. | 428/220 |
| 2011/0165780 A1 | 7/2011 | Kanjolia et al. | 438/785 |
| 2011/0184156 A1 | 7/2011 | Jones | 534/15 |
| 2012/0177845 A1 | 7/2012 | Odedra et al. | 427/569 |
| 2012/0178266 A1 | 7/2012 | Heys et al. | 438/785 |

FOREIGN PATENT DOCUMENTS

| | | |
|---|---|---|
| JP | 2005-504432 | 2/2005 |
| JP | 2005-171291 | 6/2005 |
| JP | 2005-523384 | 8/2005 |
| JP | 2006-165537 | 6/2006 |
| JP | 2009-539237 | 11/2009 |
| JP | 2010-506378 | 2/2010 |
| KR | 20080101040 | 4/2010 |
| TW | 200540291 | 12/2005 |
| WO | WO 02/27063 | 4/2002 |
| WO | WO 2006/131751 | 12/2006 |
| WO | WO 2007/066546 | 6/2007 |
| WO | WO 2007/140813 | 12/2007 |
| WO | WO 2007/141059 | 12/2007 |
| WO | WO 2009/036045 | 3/2009 |
| WO | WO 2009/036046 | 3/2009 |
| WO | WO 2009/086263 | 7/2009 |
| WO | WO 2009/106433 | 9/2009 |
| WO | WO 2009/117583 | 9/2009 |
| WO | WO 2009/143452 | 11/2009 |
| WO | WO 2009/143458 | 11/2009 |
| WO | WO 2009/155507 | 12/2009 |
| WO | WO 2009/155520 | 12/2009 |
| WO | WO 2011/115878 | 9/2011 |
| WO | WO 2012/027575 | 3/2012 |

OTHER PUBLICATIONS

Codato S et al., *MOCVD Growth and Characterization of ZrO$_2$ Thin Films Obtained from Unusual Organo-Zirconium Precursors*, Chem. Vap. Deposition 5(4): 159-164 (1999).

International Preliminary Report on Patentability for PCT/GB2006/002119 issued on Feb. 1, 2008.

International Search Report and Written Opinion for PCT/GB2006/002119 issued on Sep. 29, 2006.

Niinisto J et al., *Controlled Growth of HfO$_2$ Thin Films by Atomic Layer Deposition from Cyclopentadienyl-Type Precursor and Water*, J. Mater. Chem. 15(23)2271-2275 (2005).

Niinisto J et al., *Processing of Y$_2$O$_3$ Thin Films by Atomic Layer Deposition from Cyclopentadienyl-Type Compounds and Water as Precursors*, Chem. Mater. 16(15) 2953-2958 (2004).

Niinisto J et al., *Structural and Dielectric Properties of thin ZrO$_2$ Films on Silicon Grown by Atomic Layer Deposition from Cyclopentadienyl Precusor*, J. Appl. Phys. 95(1):84-94 (2004).

Bharara et al., (1974) "Reactions of titanium alkoxides with (methylamino) alcohols", *Zeitschrift für anorganische und allgemeine Chemie*, 403(3):337-346.

Jones, A.C., et. al. (2006) "MOCVD and ALD of high-K dielectric oxides using alkoxide precursors" Chem. Vap. Deposition 12: 83-98.

Niinisto, et. al. (2007) "ALD of ZrO2 thin films exploiting novel mixed alkylamido-cyclopentadienyl precursors" E-MRS Fall Meeting 2007. Oral Presentation. Sep. 18, 2007. Warsaw, Poland.

Rushworth, et. al. (2007) "Thermal stability studies for advanced hafnium and zirconium ALD precursors", Surface & Coating Technology, 201:9060-9065.

International Search Report for PCT/US2008/075830 dated Feb. 11, 2009.

International Search Report for PCT/US2008/075831 dated Jan. 14, 2009.

Office Action dated Oct. 17, 2007 in U.S. Appl. No. 10/493,667.
Office Action dated Dec. 9, 2005 in U.S. Appl. No. 10/493,667.
Office Action dated Nov. 17, 2010 in U.S. Appl. No. 12/207,973.
Office Action dated Nov. 15, 2010 in U.S. Appl. No. 12/207,968.

An, J., et. al. (2005) "Piano stool complexes containing the bulky pentaphenylcyclopentadienyl (C$_5$Ph$_5$) ligand: preparation, characterization and X-ray structure of C$_5$Ph$_5$Zr(N(CH$_3$)$_2$)$_3$(I)" Journal of Organometallic Chemistry 690:4376-4380.

Carta, G., et al. (2002) "Synthesis and characterization of metal oxide multilayers obtained via MOCVD as protective coatings of graphite against oxidation" Surface and Coatings Technology, 160:124-131.

Codato, S., et al. (1998) "Mass spectrometry as an ancillary tool in metallo-organic chemical vapour deposition studies. The case of zirconium-cyclopentadienyl derivatives" Rapid Communications in Mass Spectrometry, 12(24):1981-1985.

George, S., et. al. (1996) "Surface chemistry for atomic layer growth" Journal Physical Chemistry, 100:13121-13131.

Potter, R., et. al. (2005) "Deposition of HfO$_2$, Gd$_2$O$_3$ and PrO$_x$ by liquid injection ALD techniques" Chemical Vapor Deposition, 11(3):159-169.

Špatenka, P., et al. (1995) "Langmuir probe measurements during plasma-activated chemical vapor deposition in the system argon / hydrogen / dicyclopentadienyldimethylhafnium" Plasma Chemistry and Plasma Processing, 15(3):371-381.

Špatenka, P., et al. (1995) "Formation of hafnium carbide thin films by plasma enhance chemical vapor deposition by bis(η-cyclopentadienyl)dimenthylhafnium as precursor" Applied Physics A: Materials Science & Processing, 60(3):285-288.

Wright, P., et al. (2002) "Metal organic chemical vapor deposition (MOCVD) of oxides and ferroelectric materials" Journal of Materials Science: Materials in Electronics 13:671-678.

Wu, Q., et. al.(2006) "Diphenyl substituted cyclopentadienyl titanium trichloride derivatives: synthesis, crystal structure and properties as catalysts for styrene polymerization" Polyhedron 25:2565-2570.

Office Action for Chinese Application No. 200680042907.8 dated Jan. 8, 2010.

Office Action for Chinese Application No. 200880106859.3 dated Apr. 8, 2011.

Office Action for Chinese Application No. 200880106859.3 dated Oct. 18, 2011.

Office Action for Chinese Application No. 200880106796.1 dated May 4, 2011.

Examiner's Report for EP Application No. 08799401.8 dated Apr. 1, 2011.

Examiner's Report for EP Application No. 06744168.3 dated Oct. 1, 2012.

Examiner's Report for EP Application No. 06744168.3 dated Aug. 25, 2011.

(56) References Cited

OTHER PUBLICATIONS

Examiner's Report for EP Application No. 06744168.3 dated Jun. 8, 2010.
Examiner's Report for EP Application No. 06744168.3 dated May 28, 2009.
Examination Report for GB Application No. 0523339.0 dated May 5, 2010.
Examination Report for GB Application No. 0523339.0 dated Mar. 31, 2006.
Examination Report for GB Application No. 0523339.0 dated Dec. 4, 2006.
Examination Report for GB Application No. 0523339.0 dated Feb. 15, 2010.
Examination Report for GB Application No. 0523339.0 dated Jan. 19, 2009.
Office Action for Japanese Application No. 2008-540670 dated Jun. 19, 2012.
Office Action for Japanese Application No. 2008-540670 dated Mar. 17, 2012.
Office Action for Japanese Application No. 2010-524955 dated Jun. 25, 2012.
Office Action for Japanese Application No. 2010-524954 dated Jun. 25, 2012.
Office Action for Taiwanese Application No. 095126146 dated Apr. 26, 2010.
International Preliminary Report on Patentability for PCT/US2008/075831 dated Mar. 16, 2010.
International Preliminary Report on Patentability for PCT/US2008/075830 dated Mar. 16, 2010.
Office Action dated Mar. 25, 2011 in U.S. Appl. No. 12/207,973.
Office Action dated Aug. 12, 2011 in U.S. Appl. No. 12/207,973.
Korean Office Action for Application No. 10-2008-7014009 dated Mar. 4, 2013.

* cited by examiner

Growth data for (MeCp)$_2$Hf(OMe)Me/O$_3$

Growth data for (MeCp)$_2$Hf(OMe)Me/O$_3$

USE OF CYCLOPENTADIENYL TYPE HAFNIUM AND ZIRCONIUM PRECURSORS IN ATOMIC LAYER DEPOSITION

This invention concerns chemical vapour deposition, especially atomic layer deposition (ALD) and precursors therefor.

In ALD, thermal decomposition of the precursors is undesirable as the mechanism is purely a chemical reaction on the growth surface. Alternate precursors are applied with a self-limiting reaction depositing one monolayer at a time in an extremely uniform manner. Any thermal breakdown of the precursor means that the self-limiting growth is lost and so the layers formed are not good.

For ALD of hafnium based oxide materials, tetrakis(ethylmethyl)hafnium (IV) (hafnium methylethylamide, $Hf(NEtMe)_4$) is reportedly the best available precursor but is not sufficiently stable for use in ALD in practice.

An alternative hafnium precursor has been proposed, namely, bis(cyclopentadienyl) hafnium (IV) dimethyl ($Cp_2HfMe_2$). This precursor is, however, a solid having low volatility and so suffers from transport problems.

An object of this invention is to provide precursors suitable for chemical vapour deposition, especially ALD, of hafnium oxide and zirconium oxide and a method of depositing hafnium oxide or zirconium oxide.

According to a first aspect of the invention there is provided a use for a precursor in the atomic layer deposition (ALD) of hafnium oxide or zirconium oxide, wherein the precursor has the general formula:

$$(R^1Cp)_2MR^2$$

wherein Cp represents a cyclopentadienyl ligand, $R^1$ is a substituting alkyl group, alkoxy group or amido group of the Cp ligand, $R^2$ is an alkyl group, an alkoxy group or an amido group and M is hafnium or zirconium.

A second aspect of the present invention provides a method of depositing hafnium oxide or zirconium oxide by atomic layer deposition using a precursor of the general formula:

$$(R^1Cp)_2MR^2R^3$$

wherein Cp represents a cyclopentadienyl ligand, $R^1$ is a substituting alkyl group, alkoxy group or amido group of the Cp ligand, $R^2$ and $R^3$ are the same or different and are selected from alkyl groups, alkoxy groups and amido groups and M is hafnium or zirconium.

Preferably the $R^2$ and $R^3$ ligands have 1 to 4 carbon atoms, especially 1 or 2 carbon atoms. In one preferred embodiment the precursor used in the invention is bis(methylcyclopentadienyl) hafnium (IV) dimethyl, $(MeCp)_2HfMe_2$. This compound has been found to be a low melting point solid with slightly higher volatility than the above-mentioned prior art precursors. Bis(methycyclopentadienyl) zirconium (IV) dimethyl, $(MeCp)_2ZrMe_2$, is an example of a preferred zirconium oxide precursor. An alternative is bis(methylcyclopentadienyl) hafnium (IV) methyl ethyl, $(MeCp)_2HfMe(Et)$.

According to yet a third aspect of the invention there is provided novel precursors suitable for chemical vapour deposition, especially ALD, of hafnium oxide or zirconium oxide having the formula:

$$(Cp_2MR^4R^5)$$

wherein $R^4$ and $R^5$ are the same or different and selected from alkoxy groups and amido groups, Cp represents a cyclopentadienyl ligand and M is hafnium or zirconium.

Preferably, the precursor contains at least one alkoxide ligand. Preferred precursor of this formula are when $R^4$ and $R^5$ are the same especially bis(cyclopentadienyl)bis(methoxy) hafnium (IV), $Cp_2Hf(OMe)_2$, wherein Me represents a methyl group and the zirconium equivalent, $CP_2Z_r(OMe)_2$.

A fourth aspect of the present invention provides novel precursors suitable for chemical vapour deposition, especially ALD of hafnium oxide or zirconium oxide having the formula:

$$(R^6Cp_2MR^4OR^5)$$

wherein Cp represents a cyclopentadienyl ligand, $R^4$ is selected from an alkyl group and an alkoxy group, $R^5$ is an alkyl group and $R^6$ is a H, substituting alkyl group, alkoxy group or amido group of the Cp ligand and M is hafnium or zirconium.

Preferably, the $R^4$ and $R^5$ ligands have 1 to 4 carbon atoms, especially 1 or 2, ideally 1. $R^6$ is preferably H or an alkyl group having 1 or 2 carbon atoms, especially Me.

Preferred precursors include those where $R^4$ is an alkoxide group, particularly bis(methylcyclopentadienyl)bis(methoxy) hafnium (IV), $(MeCp)_2Hf(OMe)_2$, and its equivalent zirconium components. Alternatively, preferred precursors are those that contain three different ligands, i.e., having the formula:

$$(R^6Cp)_2MR^4OR^5$$

as defined above but wherein $R^4$ is not an alkoxide group, particularly bis(methylcyclopentadienyl)methyl methoxy hafnium (IV), $(MeCp)_2Hf(OMe)Me$ wherein Me represents a methyl group and the equivalent zirconium components.

Deposition of hafnium oxide or zirconium oxide from precursors according to the third and fourth aspects of the invention is preferably by means of ALD but other deposition techniques, wherein two reactant sources are delivered to a substrate in a controlled sequence, may be used, such as atomic vapour deposition (AVD) and atomic layer epitaxy (ALE). Typically the precursor may be delivered to a substrate in pulses alternating with pulses of a suitable oxygen source, such as $H_2O$, $O_2$ or ozone.

The precursor may be delivered to the substrate by any suitable means, examples of which include conventional bubbling of carrier gas, vapour draw or other techniques using neat compounds. Alternatively compound solutions may be prepared and injected into evaporators to put them in the vapour phase for delivery to a growth chamber.

It is envisaged that ALD using this precursor will be suitable for applications such as DRAM and CMOS for memory and logic applications in silicon chips.

This invention will be further described by means of the accompanying drawings, in which.

This invention will now be further described by means of the following Examples.

EXAMPLE 1

Preparation of Bis(Methylcyclopentadienyl) Hafnium (Iv) Dimethyl $(MeCp)_2HfMe_2$

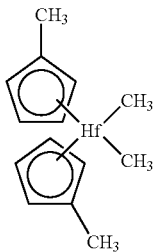

$(MeCp)_2HfMe_2$ was prepared in a one-pot method as follows. The reaction of 2 equivalents of methylcyclopentadiene with 4 equivalents of MeLi solution in $Et_2O$, followed by the treatment with 1 equivalent of $HfCl_4$ gave brown liquid crude product in 87% yield. The product was purified by vacuum distillation of crude product at 80-120° C./0.3-0.5 torr to give a wax-like compound (68%). Melting point ~30-40 C. Elemental analysis of this compound was in good agreement with theory (%): C: 45.40 (cal: 45.80); H: 5.40 (cal: 5.45)

Note the reaction scale was targeted to yield 100 g of purified product. Increased batch size may be achieved by directly scaling quantities and using appropriately sized equipment.

Figure 1:
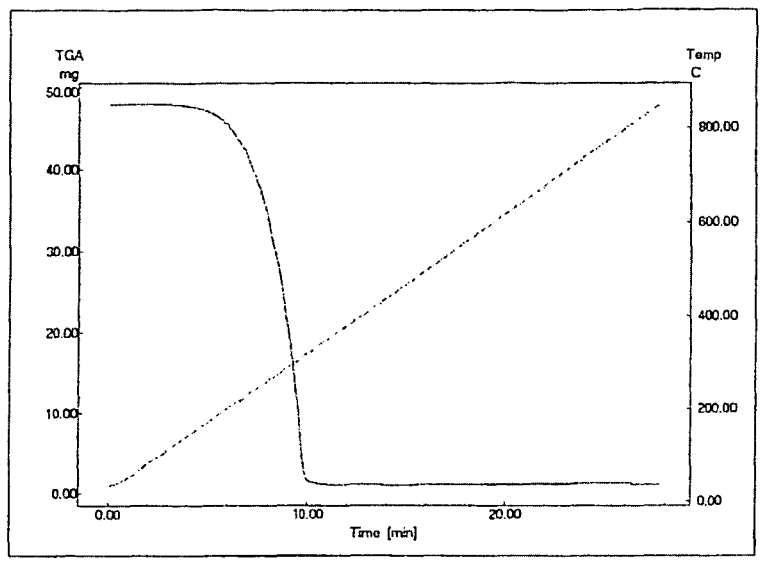
FIG. 1 shows TGA data for purified $(MeCp)_2HfMe_2$.

Thermal behaviour of the product was tested with a thermal gravimetric analyzer (TGA) with temperature increases of 20° C./min and 40° C./min. The graph (FIG. 1) showed that purified $(MeCp)_2HfMe_2$ started to vapourise at 50° C. and finish at 300° C. with less than 4% non-volatile residues.

Figure 2:
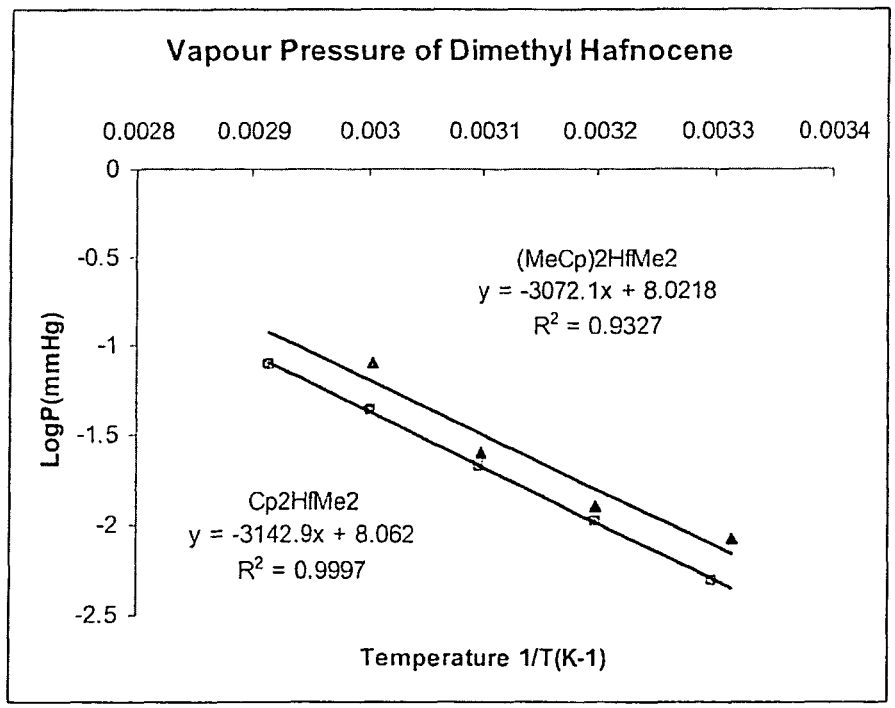
FIG. 2 is a vapour pressure plot for dimethylhafnocene derivatives.

The vapour pressure of $(MeCp)_2HfMe_2$ was tested in the temperature range of 30° C. to 70° C. and the plot is in the following FIG. 2, which compares the known source $Cp_2HfMe_2$ with $(MeCp)_2HfMe_2$, and shows a beneficial improvement in volatility for the new compound.

EXAMPLE 2

Report on ALD Studies on $(MeCp)_2HfMe_2$

The equipment used was a standard ALD reactor (Microchemistry F-120) operating at a pressure of 2-3 mbar. The $(MeCp)_2HfMe_2$ precursor was observed to melt at 43-44° C. under these conditions and could be suitably evaporated at about 60° C. to allow controlled introduction to the growth chamber.

Figure 3:
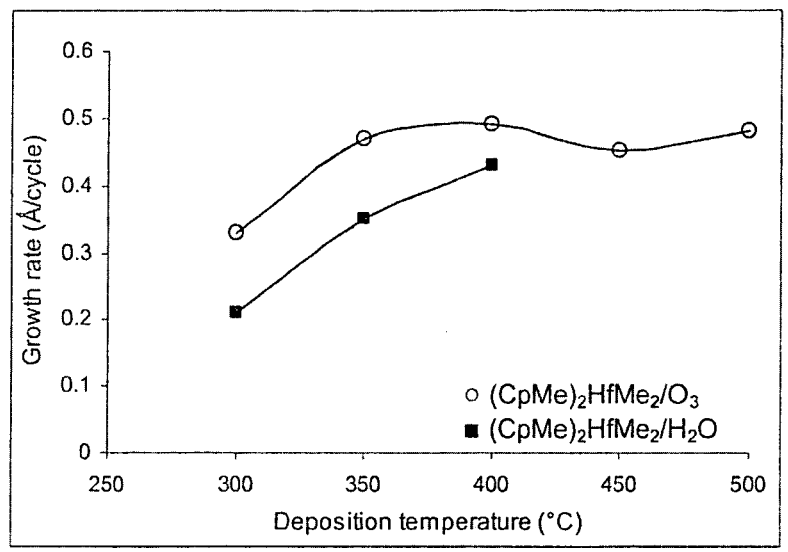
FIGS. 3 and 3a are plots of growth rate as a function of deposition temperature for deposition from $(CpMe)_2HfMe_2$ with $O_3$ and $H_2O$.
Figure 3A:
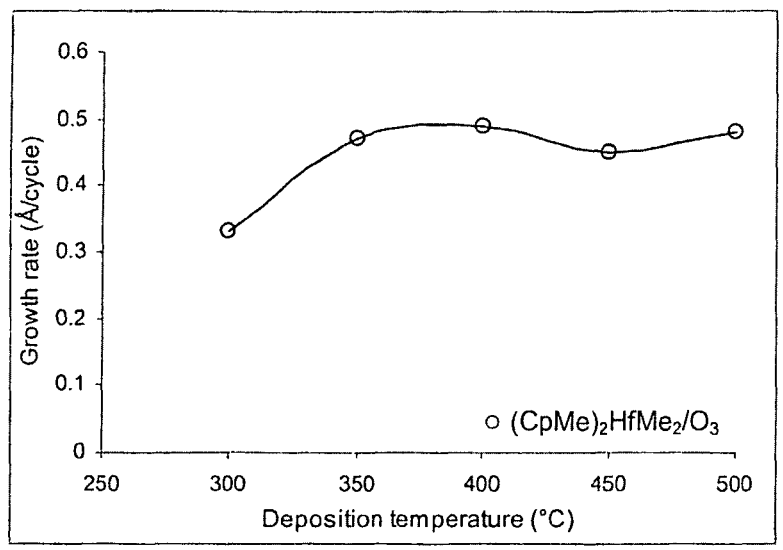

Several runs have been performed to deposit on Si(100) with $H_2O$ and $O_3$ as the oxygen source. Growth rate against deposition temperature is shown in FIGS. 3 and 3a.

Figure 4:
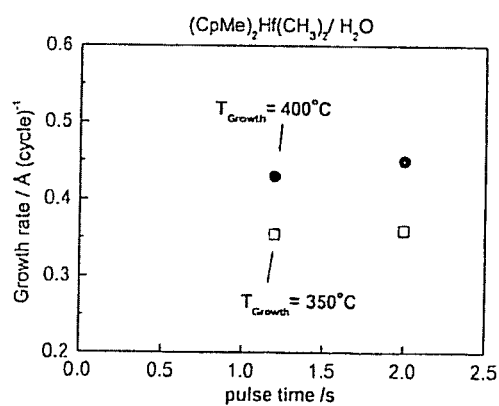
FIGS. 4 and 4a are plots of growth rate as a function of $(CpMe)_2HfMe_2$ pulse length at deposition temperature of 350° (and 400° C.) using water and ozone as oxygen sources.
Figure 4A:
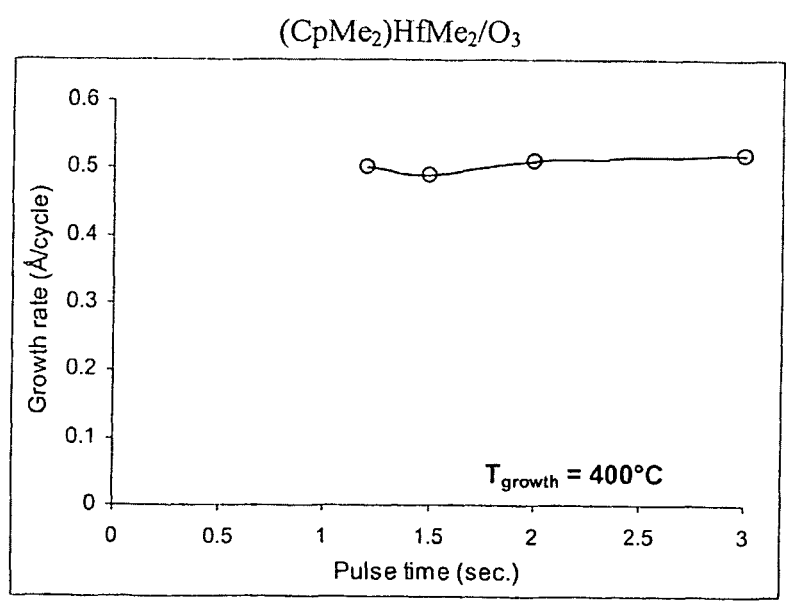

Growth rate at 350° C. is 0.36 Å/cycle, which is slightly lower than with $Cp_2HfMe_2/H_2O$ process (Niinistö J. et al. J. Mater. Chem. 2005). Films could be grown at 300° C. but growth rate is rather low. At 350° C. and 400° C. the ALD type saturative growth seems to be dominant as shown in FIGS. 4 and 4a.

Uniformity was good (+−1 nm) over the substrate are (5×10 $cm^2$) for all trials.

Figure 5:
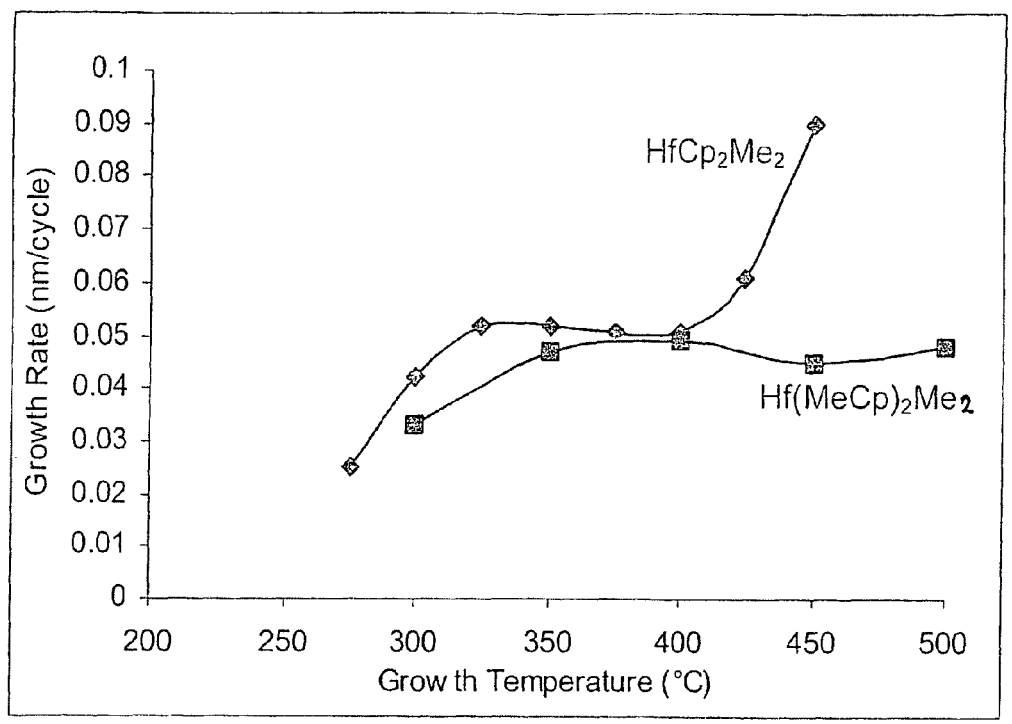
FIG. 5 is a plot of growth rate (mm/cycle) versus growth temperature (° C.) for atomic layer deposition using $HfCp_2Me_2$ and $(MeCp)_2HfMe_2$.

FIG. 5 is a plot of ALD performance for $Cp_2HfMe_2$ and $(MeCp)_2HfMe_2$. It is clear that the addition of a methyl group to the Cp ring has a profound effect on the temperature range over which the ALD self-limiting growth process holds true. For the prior art compound $Cp_2HfMe_2$, the self-limiting regime ends around 400° C. as demonstrated by a steep rise in growth. In contrast, $(MeCp)_2HfMe_2$ clearly remains self-limiting up to 500° C. This dramatic change observed with the new precursor for ALD was not expected.

EXAMPLE 3

Preparation of Bis(Cyclopentadienyl)Bis(Methoxy) Hafnium (IV), $(Cp)_2Hf(OMe)_2$

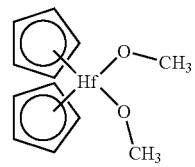

Synthesis of this compound involved a two stage process starting from hafnium tetra-amide and substituting first the Cp and then alkoxide groups as follows. $Hf(NMe_2)_4$ (58 g, 0.16 mol) was dissolved in toluene (500 mls), and CpH (27 mls, 0.4 mmol) was added and the mixture heated to reflux for 2 hours. Another 20 mls of CpH was added and the mixture reheated to reflux for another 2 hours. An aliquot was taken for NMR, which showed the right integrations for $Cp_2Hf(NMe_2)_2$. The solvent was removed to give a yellow/brown solid in 60 g (94%) yield.

$Cp_2Hf(NMe_2)_2$ (30 g, 0.075 mol) was dissolved in toluene (250 mls) and MeOH (6 mls, 4.8 g, 0.15 mol) added slowly. The solution was heated to reflux for 2 hours then the solvent removed under vacuum to give a dark brown oil. The oil was dried under vacuum, which then became a very thick immobile oil. The product was extracted in toluene and transferred to a sublimation flask. The solvent was removed under vacuum and the product sublimed onto a cold finger.

Figure 6:
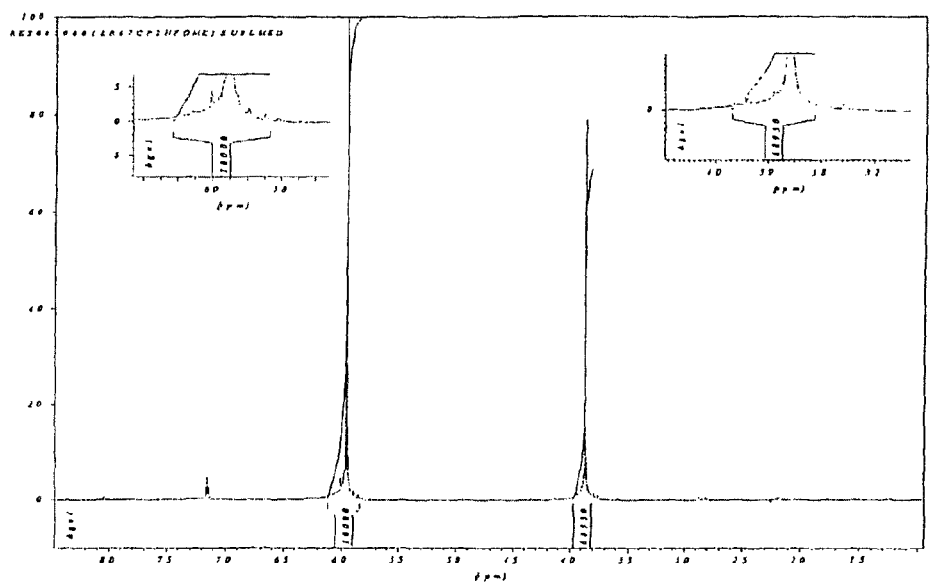
FIG. 6 shows proton NMR for $Cp_2Hf(OMe)_2$.

A white crystalline solid was collected at 60-70° C. @ 0.5 torr. $^1$H NMR analysis of the crystals showed only the 2 major peaks expected for $Cp_2Hf(OMe)_2$ (FIG. 6).

EXAMPLE 4

Preparation of Bis(Methylcyclopentadienyl)Methylmethoxy Hafnium (IV), $(MeCp)_2Hf(OMe)Me$

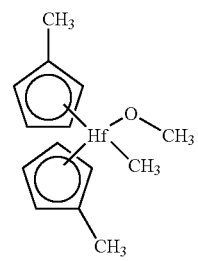

9.3 g (0.025 moles) of (Me-Cp)$_2$HMe$_2$ was dissolved in 60 ml of toluene. 2.2 ml (0.052 moles) of anhydrous methanol was added. The reaction was stirred overnight and volatiles removed in vacuo.

Yield: 9.6 g (96%) yellow liquid.

Figure 7:
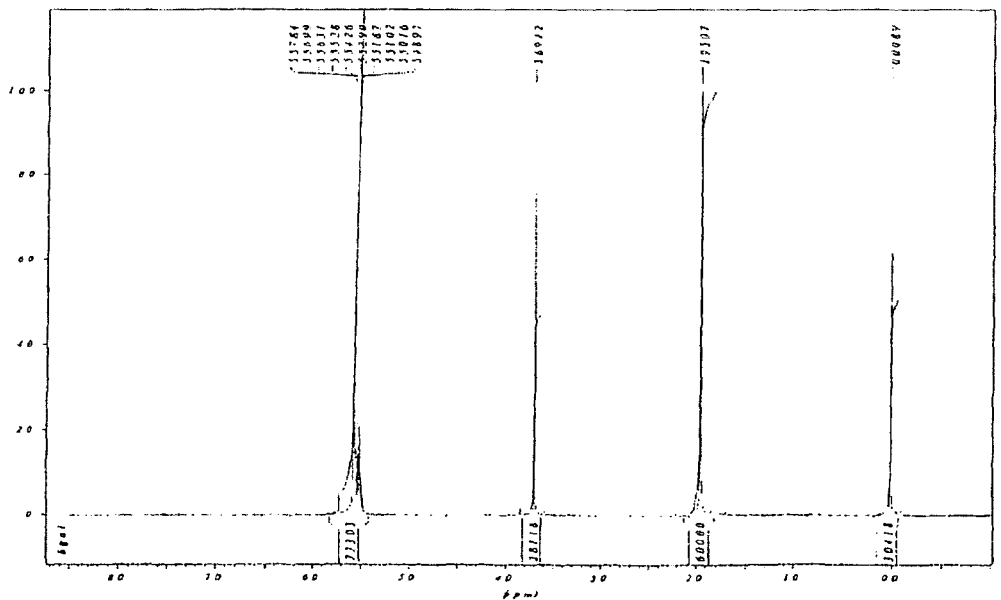
FIG. 7 shows proton NMR for $(MeCp)_2Hf(OMe)Me$.

Elemental Analysis: Calc C, 43.93; H, 5.27. Found C, 43.53; H, 5.24. NMR see FIG. 7. The peaks observed are as expected for the product.

It should be noted that further addition of methanol did not change the product and full substitution of the alkoxide for the alkyl group could not be achieved by this method.

The liquid nature of this precursor results in it being much more suited to the vapour delivery approach commonly employed in ALD compared with prior art precursors.

Figure 9:
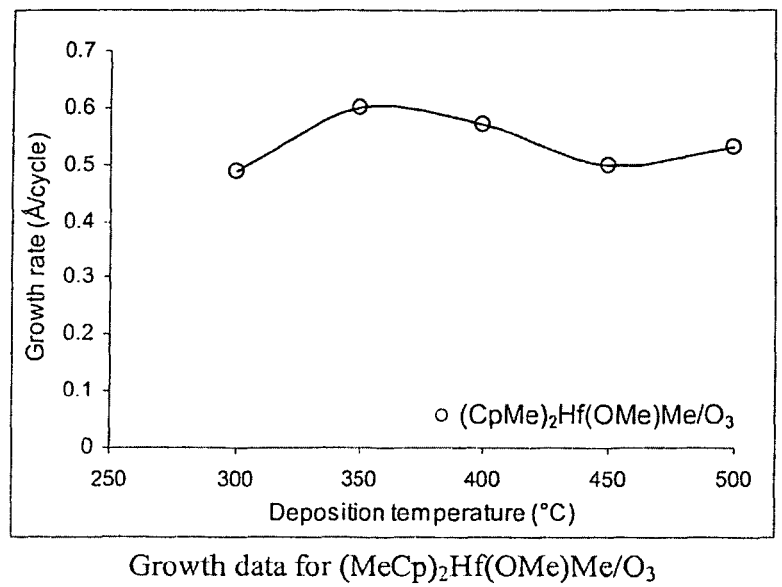
FIGS. 9 and 10 are plots of growth rate using $(MeCp)_2Hf(OMe)Me$ as a function of deposition temperature (° C.) and pulse length (sec), using ozone as the oxygen source.
Figure 10:
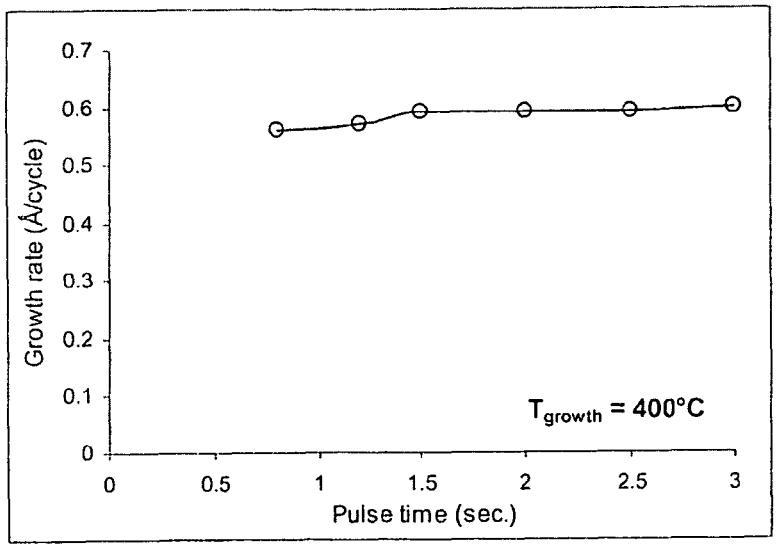

FIGS. 9 and 10 illustrate the growth data for this precursor against the deposition temperature (° C.) and pulse time (sec) respectively.

EXAMPLE 5

Comparison of TGA Data

Figure 8:
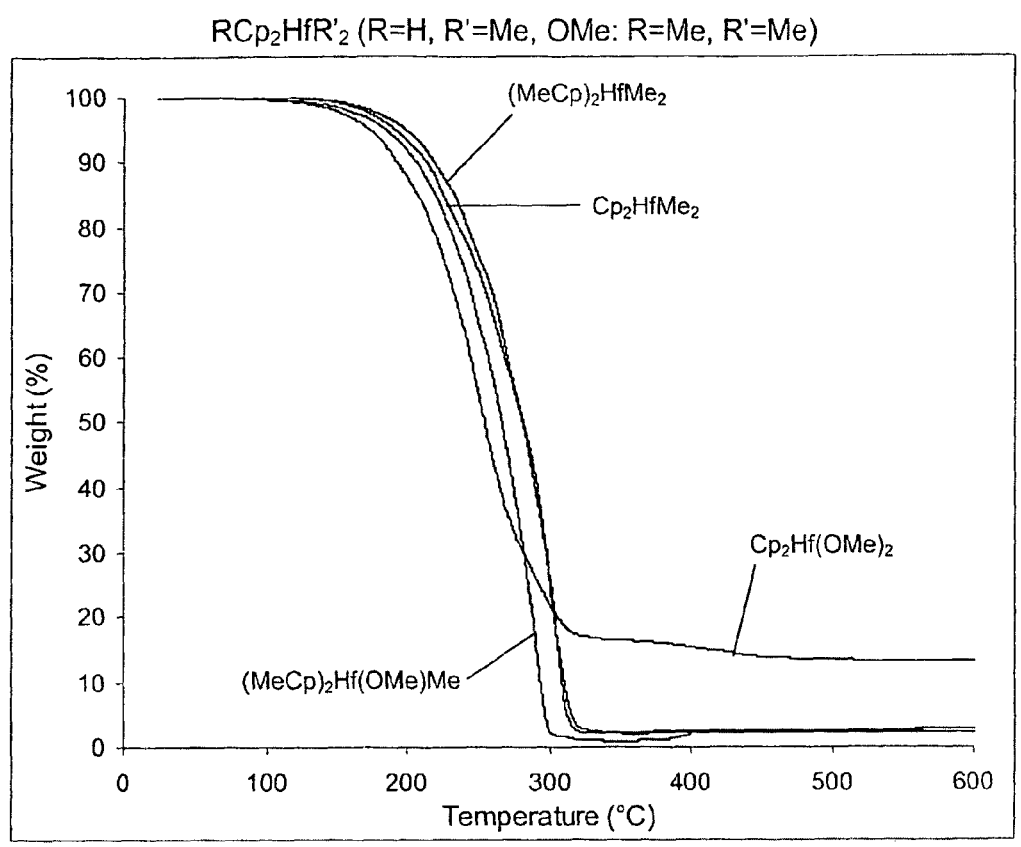
FIG. 8 is a comparison of TGA data for various Hf precursors.

A comparison of TGA data for a number of compounds is given in FIG. 8 to highlight the improvements achieved by molecular tailoring. The MeCp derivatives are clearly superior to unsubstituted Cp compounds with much reduced residues implying greater thermal stability and the ability to vapourise without decomposition.

It is expected that other substituted Cp derivatives in combination with different alkoxide and alkyl groups will have similar properties and by careful choice of the precise groups involved optimised precursors can be isolated for each deposition process.

The invention claimed is:

1. A method of depositing hafnium oxide or zirconium oxide by atomic layer deposition, the method comprising delivering a precursor to a substrate, wherein the precursor is delivered to the substrate in pulses alternating with pulses of an oxygen source and wherein the precursor has the general formula (R$^6$Cp)$_2$MR$^4$OR$^5$ wherein
Cp is a cyclopentadienyl ligand,
R$^4$ is an alkyl group or alkoxide group,
R$^5$ is an alkyl group,
R$^6$ is hydrogen or an alkyl group, and
M is hafnium or zirconium.

2. The method of claim 1, wherein the oxygen source is selected from the group consisting of H$_2$O, O$_2$ and ozone.

3. The method of claim 1, wherein the precursor is delivered to the substrate by bubbling of carrier gas, vapor draw or other techniques using neat compounds.

4. The method of claim 1, wherein a precursor compound solution is prepared and injected into an evaporator to put the precursor compound solution into the vapor phase for delivery to a growth chamber.

5. The method of claim 1, wherein the method is used to deposit hafnium oxide or zirconium oxide on a silicon chip, wherein the silicon chip is used for memory and logic applications.

6. The method of claim 1, wherein the precursor has the general formula (R$^6$Cp)$_2$MR$^4$OR$^5$ wherein
R$^4$ is a C$_1$-C$_4$-alkyl group or a C$_1$-C$_4$-alkoxide group,
R$^5$ is a C$_1$-C$_4$-alkyl group, and
R$^6$ is hydrogen or a C$_1$-C$_2$-alkyl group.

7. The method of claim 6, wherein the precursor has the general formula (R$^6$Cp)$_2$MR$^4$OR$^5$ wherein
R$^4$ is a C$_1$-C$_2$-alkyl group or a C$_1$-C$_2$-alkoxide group,
R$^5$ is a C$_1$-C$_2$-alkyl group, and
R$^6$ is hydrogen or a C$_1$-C$_2$-alkyl group.

8. The method of claim 6, wherein the precursor has the general formula (R$^6$Cp)$_2$MR$^4$OR$^5$ wherein
R$^4$ is a C$_1$-C$_2$-alkyl group,
R$^5$ is a C$_1$-C$_2$-alkyl group, and
R$^6$ is hydrogen or a C$_1$-C$_2$-alkyl group.

9. The method of claim 8, wherein the precursor has the general formula (R$^6$Cp)$_2$MR$^4$OR$^5$ wherein
R$^4$ is methyl and R$^5$ is methyl.

10. The method of claim 6, wherein the precursor has the general formula (R$^6$Cp)$_2$MR$^4$OR$^5$ wherein
R$^4$ is a C$_1$-C$_2$-alkoxide group,
R$^5$ is a C$_1$-C$_2$-alkyl group, and
R$^6$ is hydrogen or a C$_1$-C$_2$-alkyl group.

11. The method of claim 10, wherein the precursor has the general formula (R$^6$Cp)$_2$MR$^4$OR$^5$ wherein
R$^4$ is methoxy and R$^5$ is methyl.

12. The method of claim 1, wherein the precursor has the general formula (R$^6$Cp)$_2$MR$^4$OR$^5$ wherein
M is hafnium.

13. The method of claim 1, wherein the precursor has the general formula (R$^6$Cp)$_2$MR$^4$OR$^5$ wherein
M is zirconium.

14. The method of claim 1, wherein the precursor is bis (cyclopentadienyl) hafnium (IV) bis(methoxy).

15. The method of claim 1, wherein the precursor is bis (methylcyclopentadienyl) hafnium (IV) bis(methoxy).

16. The method of claim 1, wherein the precursor is bis (methylcyclopentadienyl) zirconium (IV) bis(methoxy).

17. The method of claim 1, wherein the precursor is bis (methylcyclopentadienyl) hafnium (IV) methyl methoxy.

18. The method of claim 1, wherein the precursor is bis (methylcyclopentadienyl) zirconium (IV) methyl methoxy.

19. A method of depositing hafnium oxide or zirconium oxide by atomic layer deposition, the method comprising delivering a precursor to a substrate, wherein the precursor is delivered to the substrate in pulses alternating with pulses of an oxygen source and wherein the precursor is bis(cyclopentadienyl) zirconium (IV) bis(methoxy).

* * * * *

UNITED STATES PATENT AND TRADEMARK OFFICE
CERTIFICATE OF CORRECTION

| | |
|---|---|
| PATENT NO. | : 8,568,530 B2 |
| APPLICATION NO. | : 12/093846 |
| DATED | : October 29, 2013 |
| INVENTOR(S) | : Peter Nicholas Heys, Paul Williams and Fuquan Song |

It is certified that error appears in the above-identified patent and that said Letters Patent is hereby corrected as shown below:

In the Specification

Column 2, line 2, replace "$CP_2Z_r(OMe)_2$" with -- $Cp_2Z_r(OMe)_2$ --.

Column 3, line 7, replace "Hafnium (Iv)" with -- Hafnium (IV) --.

Signed and Sealed this
Twenty-eighth Day of January, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,568,530 B2
APPLICATION NO. : 12/093846
DATED : October 29, 2013
INVENTOR(S) : Peter Nicholas Heys, Paul Williams and Fuquan Song It is certified that error appears in the above-identified patent and that said Letters Patent is hereby corrected as shown below:

In the Specification
Column 4, line 31, replace "0.4 mmol" with --0.41mol--.

Signed and Sealed this
Fifth Day of May, 2015

Michelle K. Lee
*Director of the United States Patent and Trademark Office*